(12) United States Patent
She et al.

(10) Patent No.: US 11,211,400 B2
(45) Date of Patent: Dec. 28, 2021

(54) THREE-DIMENSIONAL FLASH MEMORY DEVICE WITH INCREASED STORAGE DENSITY

(71) Applicant: Yangtze Memory Technologies Co., Ltd., Wuhan (CN)

(72) Inventors: Min She, Wuhan (CN); Qiang Tang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 56 days.

(21) Appl. No.: 16/699,121

(22) Filed: Nov. 29, 2019

(65) Prior Publication Data
US 2020/0411539 A1 Dec. 31, 2020

Related U.S. Application Data

(63) Continuation of application No. PCT/CN2019/093678, filed on Jun. 28, 2019.

(51) Int. Cl.
*H01L 27/11582* (2017.01)
*H01L 27/11565* (2017.01)
*H01L 23/528* (2006.01)
*H01L 29/51* (2006.01)

(52) U.S. Cl.
CPC ...... *H01L 27/11582* (2013.01); *H01L 23/528* (2013.01); *H01L 27/11565* (2013.01); *H01L 29/518* (2013.01)

(58) Field of Classification Search
CPC ... H01L 27/115–11597; H01L 27/2454; H01L 29/7827; H01L 29/7802–7815; H01L 29/66712–66734; H01L 21/823487; H01L 21/823885
See application file for complete search history.

(56) References Cited

U.S. PATENT DOCUMENTS

| | | | | |
|---|---|---|---|---|
| 9,847,342 B2 * | 12/2017 | Nagashima | ......... | H01L 29/0649 |
| 10,103,155 B2 * | 10/2018 | Sakaike | ............ | H01L 27/11519 |
| 2009/0097316 A1 | 4/2009 | Lee | | |
| 2010/0002516 A1 | 1/2010 | Sim | | |

(Continued)

FOREIGN PATENT DOCUMENTS

| CN | 102769018 A | 11/2012 |
|---|---|---|
| CN | 107611136 A | 1/2018 |

(Continued)

*Primary Examiner* — Allen L Parker
*Assistant Examiner* — Gustavo G Ramallo
(74) *Attorney, Agent, or Firm* — Winston Hsu

(57) ABSTRACT

A 3D flash memory device includes a substrate having a substantial planar surface. A plurality of active columns of semiconducting material is disposed above the substrate. Each of the plurality of active columns extends along a first direction orthogonal to the planar surface of the substrate. The plurality of active columns is arranged in a two-dimensional array. Each of the plurality of active columns may comprise multiple local bit lines and multiple local source lines extending along the first direction. Multiple channel regions are disposed between the multiple local bit lines and multiple local source lines. A word line stack wraps around the plurality of active columns. A charge-storage element is disposed between the word line stack and each of the plurality of active columns.

20 Claims, 6 Drawing Sheets

(56) References Cited

U.S. PATENT DOCUMENTS

| | | |
|---|---|---|
| 2015/0263016 A1* | 9/2015 | Cha .................. H01L 27/11524 257/314 |
| 2016/0071876 A1* | 3/2016 | Mizuno ............. H01L 27/11582 365/185.17 |
| 2016/0078958 A1 | 3/2016 | Wang |
| 2017/0062456 A1 | 3/2017 | Sugino |
| 2017/0115884 A1 | 4/2017 | Bhalerao |
| 2017/0148517 A1* | 5/2017 | Harari ................ G11C 16/0491 |
| 2018/0108416 A1 | 4/2018 | Harari |
| 2018/0182776 A1* | 6/2018 | Kim ...................... H01L 29/518 |
| 2019/0123061 A1* | 4/2019 | Liu ...................... G11C 11/2273 |

FOREIGN PATENT DOCUMENTS

| | | |
|---|---|---|
| CN | 107623006 A | 1/2018 |
| CN | 107863348 A | 3/2018 |
| CN | 107994033 A | 5/2018 |
| CN | 108701475 A | 10/2018 |
| CN | 109192732 A | 1/2019 |
| CN | 109801922 A | 5/2019 |
| TW | 569378 | 1/2004 |
| TW | I575721 B | 3/2017 |
| TW | 201715705 A | 5/2017 |

* cited by examiner

THREE-DIMENSIONAL FLASH MEMORY DEVICE WITH INCREASED STORAGE DENSITY

CROSS REFERENCE TO RELATED APPLICATIONS

The present patent application is a continuation of PCT application Ser. No. PCT/CN2019/093678, filed Jun. 28, 2019, designating the United States, which is hereby incorporated by reference.

BACKGROUND OF THE INVENTION

1. Field of the Invention

This disclosure relates to a memory device, and more particularly, to a three-dimensional (3D) NOR flash memory device with increased storage density.

2. Description of the Prior Art

A flash memory device is a non-volatile memory device in which the stored data can be electrically erased or written (i.e., programmable). In practice, flash memory devices are widely used in computers and memory cards because they can be erased in a single process, and are electrically programmable.

There are two main types of flash memory based on the logic gates for read operation: NAND type and NOR type. For NOR flash memory, every individual memory cell can be independently read or modified, which offers full random access and thus can be used for executable-code storage with non-volatility for replacing volatile SRAM or DRAM.

As known in the art, a NOR memory string or NOR string includes a number of storage transistors each of which is connected to a shared source region and a shared drain region. Thus, the transistors in a NOR string are connected in parallel. To read or program a storage transistor in a NOR string, only that storage transistor needs to be activated (i.e., "on" or conducting), all other storage transistors in the NOR string remain dormant (i.e., "off" or non-conducting). Consequently, a NOR string allows much faster sensing of the activated storage transistor to be read.

Conventional NOR transistors are programmed by a channel hot-electron (CHE) injection technique, in which electrons are accelerated in the channel region by a voltage difference between the source region and the drain region and are injected into the charge-trapping layer between the control gate and the channel region, when an appropriate voltage is applied to the control gate.

With successive generations of flash memory chips, an emphasis continues to be placed on increasing array density and maximizing chip real estate while minimizing the cost of manufacture. It is further desirable to increase storage density of the flash memory device with little or no modification of the current process flow.

SUMMARY OF THE INVENTION

It is one object of the present disclosure to provide an improved three-dimensional (3D) NOR flash memory device with increased storage density.

According to one aspect of the present disclosure, a three-dimensional flash memory device includes a substrate having a substantial planar surface. A plurality of active columns of semiconducting material is disposed above the substrate. Each of the plurality of active columns extends along a first direction orthogonal to the planar surface of the substrate. The plurality of active columns is arranged in a two-dimensional array. Each of the plurality of active columns comprises at least two local bit lines and at least one local source line extending along the first direction. A first channel region is disposed between a first local bit line of the at least two local bit lines and the at least one local source line. A second channel region is disposed between a second local bit line of the at least two local bit lines and the at least one local source line. A word line stack wraps around the plurality of active columns. A charge-storage element is disposed between the word line stack and each of the plurality of active columns.

According to some embodiments, the word line stack extending along a second direction that is parallel to the planar surface of the substrate.

According to some embodiments, the at least two local bit lines are electrically coupled to two global bit lines, respectively.

According to some embodiments, the two global bit lines extend along a third direction that is not parallel to the second direction and is parallel to the planar surface of the substrate.

According to some embodiments, each of the two global bit lines is electrically coupled to a bit-line access select transistor, wherein the bit-line access select transistor connects each of the two global bit lines to each of the at least two local bit lines.

According to some embodiments, the charge-storage element comprises a charge-trapping layer.

According to some embodiments, the charge-trapping layer comprises silicon nitride.

According to some embodiments, the three-dimensional flash memory device further comprises: a channel breaker separating the first channel region from the second channel region.

According to some embodiments, the plurality of active columns is arranged in a staggered manner.

According to some embodiments, the substrate comprises a silicon substrate.

According to another aspect of the present disclosure, a three-dimensional flash memory device includes a substrate having a substantial planar surface. A plurality of active columns of semiconducting material is disposed above the substrate. Each of the plurality of active columns extends along a first direction orthogonal to the planar surface of the substrate. The plurality of active columns is arranged in a two-dimensional array. Each of the plurality of active columns comprises multiple local bit lines and multiple local source lines extending along the first direction. Multiple channel regions are disposed between the multiple local bit lines and multiple local source lines. A word line stack wraps around the plurality of active columns. A charge-storage element is disposed between the word line stack and each of the plurality of active columns.

According to some embodiments, the word line stack extending along a second direction that is parallel to the planar surface of the substrate.

According to some embodiments, the multiple local bit lines are electrically coupled to multiple global bit lines, respectively.

According to some embodiments, the multiple global bit lines extend along a third direction that is not parallel to the second direction and is parallel to the planar surface of the substrate.

According to some embodiments, each of the multiple global bit lines is electrically coupled to a bit-line access select transistor, wherein the bit-line access select transistor connects each of the multiple global bit lines to each of the multiple local bit lines.

According to some embodiments, the charge-storage element comprises a charge-trapping layer.

According to some embodiments, the charge-trapping layer comprises silicon nitride.

According to some embodiments, the three-dimensional flash memory device further comprises: a channel breaker between two of the multiple local bit lines.

According to some embodiments, the plurality of active columns is arranged in a staggered manner.

According to some embodiments, the substrate comprises a silicon substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
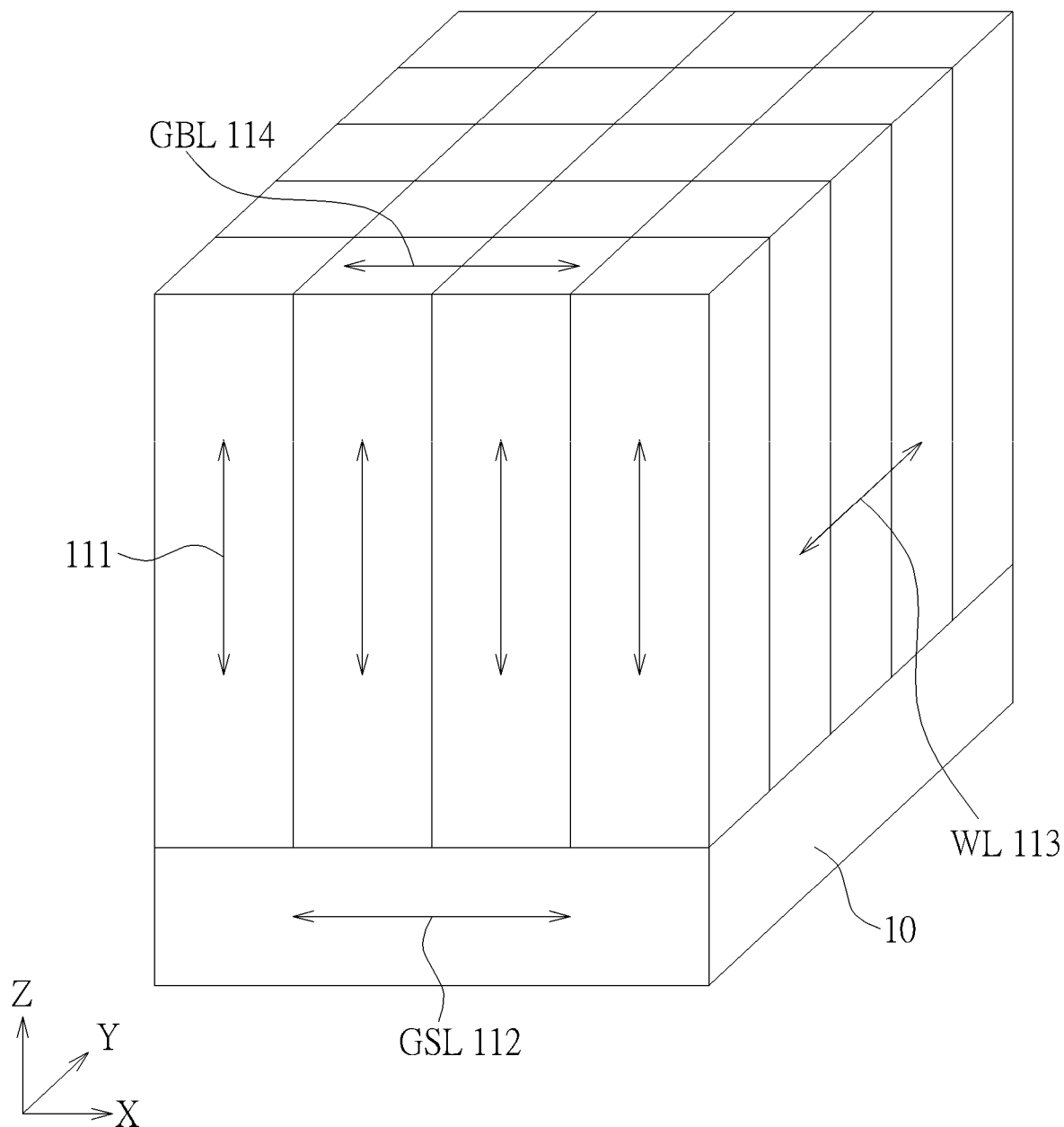
FIG. 1 shows a conceptualized memory structure, which illustrates a three-dimensional organization of memory cells provided in vertical NOR strings, with each vertical NOR string having memory cells each being controlled by one of a number of horizontal word lines, according to one embodiment of the present invention.

Embodiments of the present disclosure will be described with reference to the accompanying drawings.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It is noted that references in the specification to "one embodiment," "an embodiment," "an exemplary embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment.

Further, when a particular feature, structure or characteristic is described in contact with an embodiment, it would be within the knowledge of a person skilled in the pertinent art to affect such feature, structure or characteristic in contact with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The term "vertical" refers to the direction perpendicular to the surface of a semiconductor substrate, and the term "horizontal" refers to any direction that is parallel to the surface of that semiconductor substrate.

FIG. 1 shows a conceptualized memory structure 1, which illustrates a three-dimensional organization of memory cells (or storage elements) provided in vertical NOR strings. In conceptualized memory structure 1, each vertical NOR string includes memory cells that are each controlled by a corresponding horizontal word line, according to one embodiment of the present invention. In conceptualized memory structure 1, each memory cell is formed in deposited thin films provided "vertically", i.e., along a direction perpendicular to the surface of substrate 10. Substrate 10 may be, for example, a conventional silicon wafer or silicon substrate used for fabricating integrated circuits, but is not limited thereto. As indicated in FIG. 1, a Cartesian coordinate system is adopted solely for the purpose of facilitating discussion. Under this coordinate system, the surface of substrate 10 is considered a plane which is parallel to the X-Y plane. Thus, as used in this description, the term "horizontal" refers to any direction parallel to the X-Y plane, while "vertical" refers to the Z-direction.

In FIG. 1, each vertical column in the Z direction represents storage elements or TFTs in a vertical NOR string (e.g., vertical NOR string 111). The vertical NOR strings are arranged in a regular manner in rows each extending along the X direction. The same arrangement may be seen alternatively as an arrangement of rows each extending along the Y directions. The storage elements of a vertical NOR string may comprise a vertical local bit line and may share a vertical local source line (not shown). A stack of horizontal word lines (e.g., WL 113) run along the Y direction, with each word line serving as control gates for corresponding TFTs of vertical NOR strings located adjacent the word line along the Y direction. Global source lines (e.g., GSL 112) and global bit lines (e.g., GBL 114) may be provided along the X direction generally running either below the bottom of or on top of conceptualized memory structure 1. Alternatively, signal lines GSL 112 and GBL 114 can both be routed below or both be routed on top of conceptualized memory structure 1, each of these signal lines may be selectively connected by access transistors (not shown in FIG. 1) to the local source lines and local bit lines of individual vertical NOR strings.

For illustration purposes only, the conceptualized memory structure 1 is a multi-gate vertical NOR string array consisting of a 4×5 arrangement of vertical NOR strings, with each NOR string typically having 32 or more storage elements and access selection transistors. Although shown in FIG. 1 as a 4×5 arrangement of vertical NOR strings, with each vertical NOR strings having a number of storage elements, a memory structure of the present invention may have any number of vertical NOR strings in each row along either of the X and Y directions, and any number of storage elements in each vertical NOR string. For example, there may be thousands of vertical NOR strings arrayed in rows along both the X and Y directions, with each NOR string having, for example, 2, 4, 8, 16, 32, 64, 128, or more storage elements.

The number of storage elements in each vertical NOR string of FIG. 1 (e.g., vertical NOR string 111) corresponds to the number of word lines (e.g., WL 113) providing control gates to the vertical NOR string. The word lines may be formed as narrow, long metallic strips each extending along the Y direction. The word lines are stacked one on top of each other, and electrically isolated from each other by dielectric insulation layers there-between. The number of word lines in each stack may be any number, but preferably an integer power of 2 (i.e., $2^n$, where n is an integer).

Figure 2:
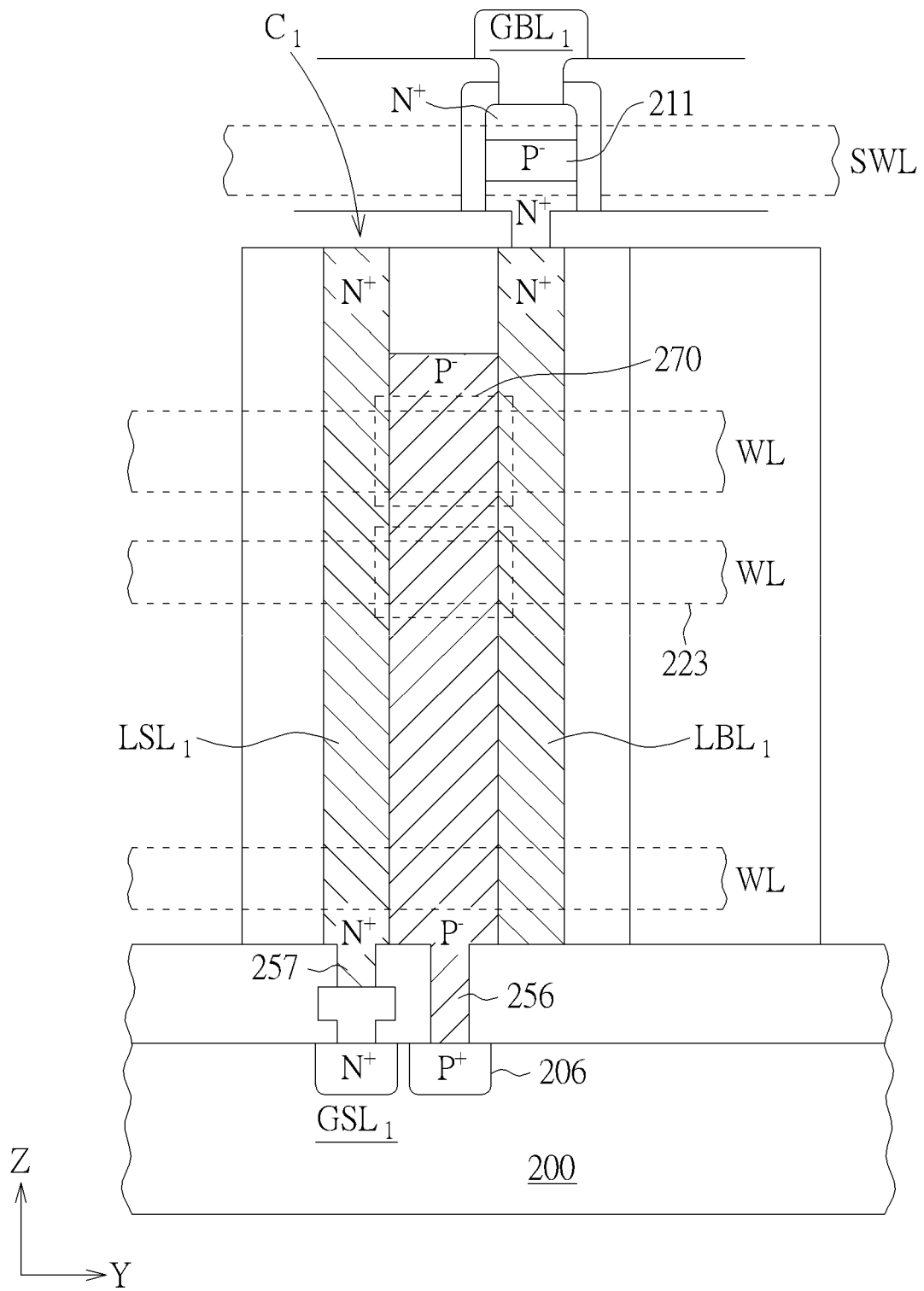
FIG. 2 is a cross section in the Z-Y plane showing connections of vertical NOR string of active column to global bit line, global source line, and common body bias source, according to one embodiment of the present invention.

FIG. 2 is a cross section in the Z-Y plane showing connections of vertical NOR string of active column $C_1$ to global bit line $GBL_1$, global source line $GSL_1$, and common body bias source 206, according to one embodiment of the present invention. As shown in FIG. 2, bit-line access select transistor 211 connects global bit line $GBL_1$ with local bit line $LBL_1$, and contact 256 optionally connects a $P^-$ body (or un-doped body) region on the active strip to body bias source 206 in the substrate 200. The bit-line access select transistor 211 is formed above active column $C_1$. However, alternatively, the bit-line access select transistor 211 may be formed at the bottom of active column $C_1$ or in substrate 200 in other embodiments.

For example, the bit-line access select transistor 211 may be formed in an isolated island of an $N^+/P^-/N^+$ doped polysilicon stack together with the access select word line SWL. When a sufficiently large voltage is applied to the select word line SWL, the $P^-$ channel is inverted, thereby connecting the local bit line $LBL_1$ to the global bit line $GBL_1$. The access select word line SWL may run along a direction (i.e., the Y direction) different from the word lines 223 which serve as control gates to the TFTs 270 of the vertical NOR string. The access select word line SWL may be formed separately from word lines 223. In one embodiment, the global bit line $GBL_1$ runs horizontally along the X direction (i.e., perpendicular to the directions of the word lines), and bit-line access select transistor 211 provides access to local bit line $LBL_1$, which is the local bit line of merely one of many vertical NOR strings that are served by global bit line $GBL_1$. To increase read and program operation efficiency, in a multi-gate NOR string array, thousands of global bit lines may be used to access in parallel the local bit lines of thousands of vertical NOR strings that are accessed by access select word line SWL. In FIG. 2, local source line $LSL_1$ may be connected to the global source line GSL1 through contact 257. It is understood that the vertical NOR string of active column $C_1$ in FIG. 2 is for illustration purposes only. It is to be understood that in some other embodiments the bit-line access select transistor 211 may be omitted.

The global source line $GSL_1$ may be decoded by decoding circuitry in substrate 200. The support circuitry may include address encoders, address decoders, sense amplifiers, input/output drivers, shift registers, latches, reference cells, power supply lines, bias and reference voltage generators, inverters, NAND, NOR, Exclusive-Or and other logic gates, other memory elements, sequencers and state machines, among others. The multi-gate NOR string arrays may be organized as multiple blocks of circuits, with each block having multiple multi-gate NOR string arrays.

Figure 3:
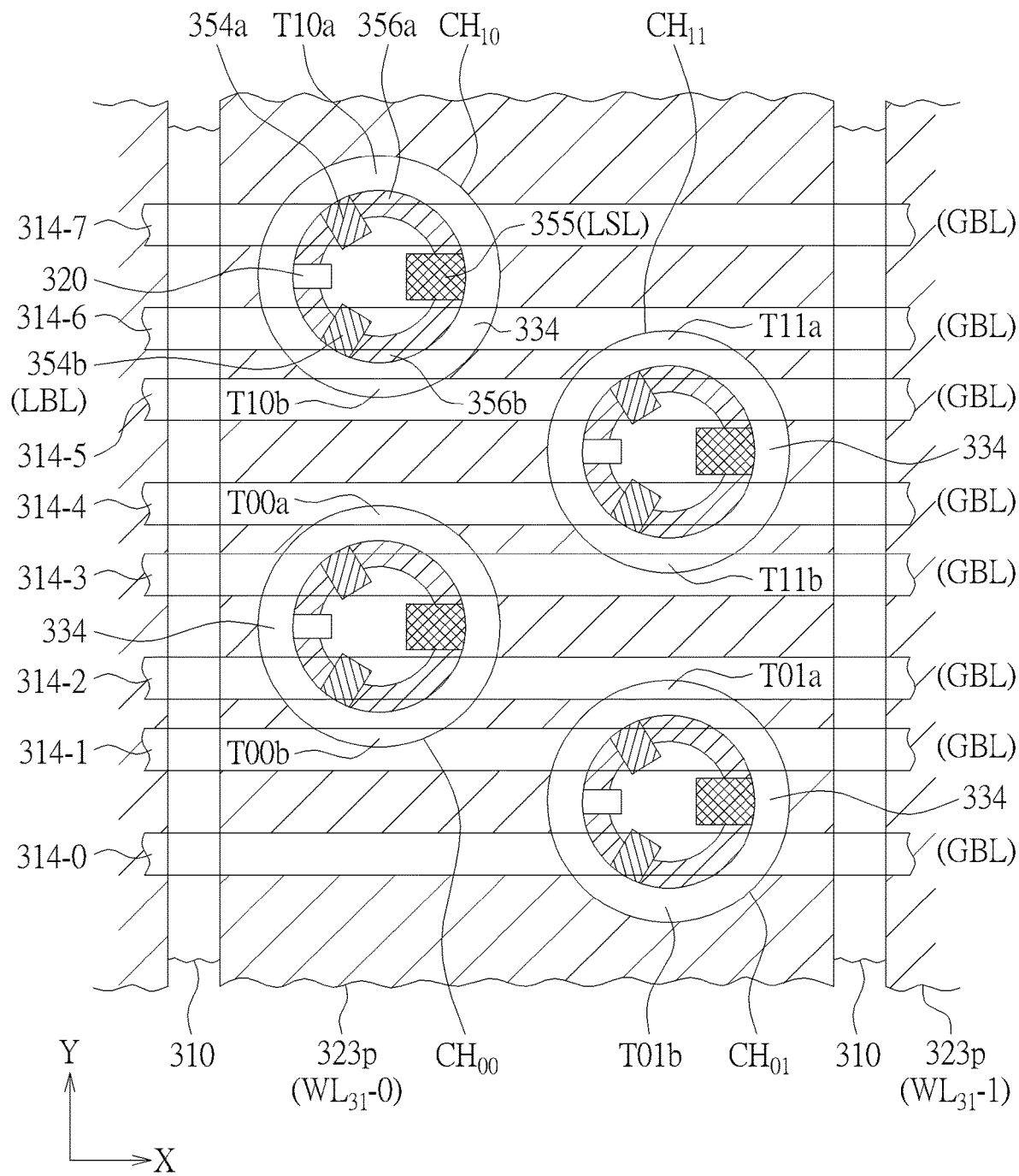
FIG. 3 is a cross section in the X-Y plane showing the staggered close-packing of vertical NOR strings sharing word-line stacks according to the embodiment of the present invention.

FIG. 3 is a cross section in the X-Y plane showing the staggered close-packing of vertical NOR strings sharing word-line stacks according to the embodiment of the present invention. According to one embodiment of the present invention, as shown in FIG. 3, multiple vertical NOR strings or active columns with wrap-around word lines are illustrated. The vertical NOR strings or active columns are staggered as to be closer together, so that word line stack 323p (WL31-0) can be shared by more vertical NOR strings.

In FIG. 3, a plurality of active columns (represented by channel holes $CH_{00}$, $CH_{01}$, $CH_{10}$, $CH_{11}$) of semiconducting material is disposed above a substrate (not shown in FIG. 3) and each of the plurality of active columns extends along a direction orthogonal to a planar surface of the substrate. The active columns are arranged in a two-dimensional array and in a staggered manner. Vertical NOR strings are formed inside channel holes $CH_{00}$, $CH_{01}$, $CH_{10}$, $CH_{11}$, respectively. The channel holes $CH_{00}$, $CH_{01}$, $CH_{10}$, $CH_{11}$ are formed by etching through a stack of metal word lines and the dielectric isolation layers between the word lines. The manufacturing process flow is similar to that of the prior art vertical NAND strings, except that the transistors in a vertical NOR string are provided parallel to each other, rather than serially in a vertical NAND wing. Within each of the four exemplary channel holes $CH_{00}$, $CH_{01}$, $CH_{10}$, $CH_{11}$, formation of transistors in a vertical NOR string is facilitated by the $N^+$ doped vertical pillars extending to the entire depth of the channel hole, provided with one shared local source line (LSL) 355 and two local bit lines (LBL) 354a and 354b for all the TFTs along the vertical NOR string.

According to one embodiment of the present invention, in each of the four exemplary channel holes $CH_{00}$, $CH_{01}$, $CH_{10}$, $CH_{11}$, undoped or lightly doped channel regions 356a and 356b are disposed adjacent to the local bit lines (LBL) 354a and 354b, respectively. The channel region 356a and 356b are separated from each other by a channel breaker 320 such as an insulating layer. Charge storage element 334 comprising a charge-trapping layer is positioned between the channel regions 356a and 356b and the word line stack 323p, thus forming a stack of 2, 4, 8, 16, 32, 64, 128 or more TFTs along the vertical active strip. According to one embodiment of the present invention, the charge-trapping layer of the Charge storage element 334 may include silicon nitride, but is not limited thereto. The charge trapping layer may be a transistor gate dielectric material consisting of, for example, a thin film of tunnel dielectric (e.g., silicon dioxide), followed by a thin layer of charge trapping material such as silicon nitride or conductive nanodots embedded in a non-conducting dielectric material, or isolated floating gates, and is capped by a layer of blocking dielectric such as ONO (Oxide-Nitride-Oxide) or a high dielectric constant film such as aluminum oxide or hafnium oxide or some combination of such dielectrics. The charge may be stored in the charge-trapping layer using channel hot-electron injection programming approach.

In the embodiment of FIG. 3, the word line stacks run in the Y direction, with individual horizontal strips 323p (WL31-0), 323p (WL31-1) being separated from each other by air gap or dielectric isolation 310. Eight exemplary global bit lines (GBL) 314-0~314-7 run horizontally in rows along the X direction, perpendicular to the word lines. Each of the eight global bit lines (GBL) 314-0~314-7 accesses local bit line (LBL) along the row of vertical strips through access select transistors (211 in FIG. 2, not shown in FIG. 3) that can be positioned above the memory array. Similarly, each global source line (not shown in FIG. 3) accesses the local source line pillars along the row. For example, the global source line may be disposed under the memory array.

In FIG. 3, two TFTs (or two memory cells) are disposed in each of the four exemplary channel holes $CH_{00}$, $CH_{01}$, $CH_{10}$, $CH_{11}$. For example, two memory cells $T_{10a}$ and $T_{10b}$ are disposed in the channel hole $CH_{10}$, two memory cells $T_{00a}$ and $T_{00b}$ are disposed in the channel hole $CH_{00}$, two memory cells $T_{11a}$ and $T_{11b}$ are disposed in the channel hole $CH_{11}$, and two memory cells $T_{01a}$ and $T_{01b}$ are disposed in the channel hole $CH_{01}$. Each vertical NOR string shown in FIG. 3 has two channel regions 356a and 356b, two local bit lines (LBL) 354a and 354b, and one shared local source line (LSL) 355. For example, the channel region 356a, the local bit line 354a, the shared local source line 355, the charge-storage element 334, and the word line 323p constitute the memory cell $T_{10a}$ in the channel hole $CH_{10}$. For example, the channel region 356b, the local bit line 354b, the shared local source line 355, the charge-storage element 334, and the word line 323p constitute the memory cell $T_{10b}$ in the channel hole $CH_{10}$. Therefore, the disclosed memory structure doubles the storage density of the vertical NOR string.

Figure 4:
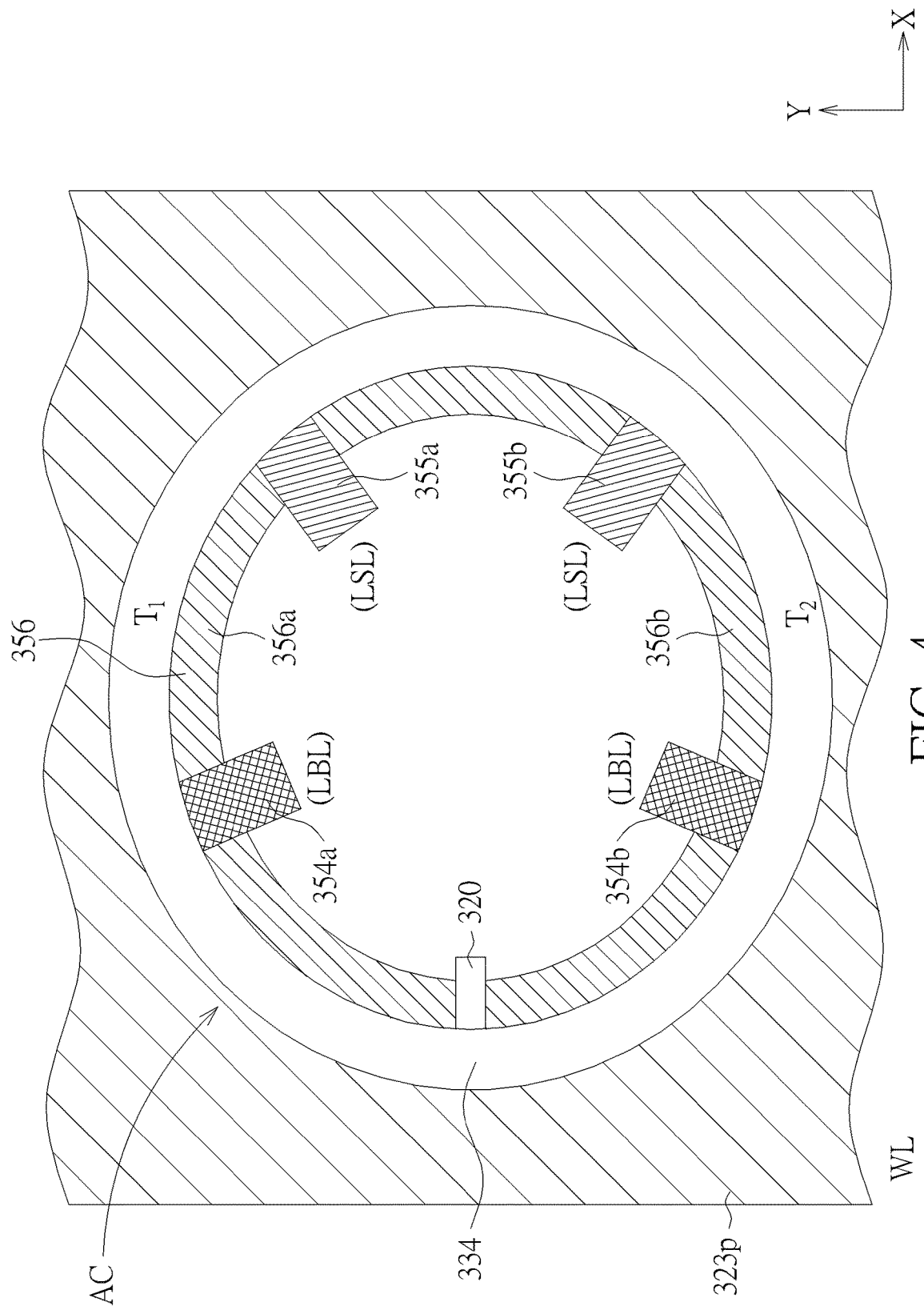
FIG. 4 is a schematic, cross-sectional diagram in the X-Y plane showing multiple local bit lines and multiple local source lines in one active column according to another embodiment of the invention.

FIG. 4 is a schematic, cross-sectional diagram in the X-Y plane showing multiple local bit lines and multiple local source lines in one active column according to another embodiment of the invention, wherein like numeral numbers designate like elements, regions or layers. As shown in FIG. 4, the active column AC is wrapped around by the word line WL. The active column AC comprises a vertical NOR string extending along the Z direction that is orthogonal to the planar surface of the substrate (not shown in FIG. 4). There may be multiple active columns arranged in a two-dimensional array and in a staggered manner on the substrate as depicted in FIG. 3.

It is understood that only one particular plane of the vertical NOR string in the active column AC is shown in FIG. 4. A circular silicon channel 356 is shown. A charge-storage element 334 comprising a charge-trapping layer is positioned between the silicon channel 356 and the word line WL. It is to be understood that the shapes of the silicon channel 356 and the active column AC are illustration purposes only. Other shapes such as oval shape, rectangular shape or irregular shape may be applicable according to various embodiments of the invention. It is to be understood that the shapes of the location of the signal lines LBL and LSL and the channel breaker is for illustration purposes only. The location of the signal lines LBL and LSL and the channel breaker may be adjusted according to processing/manufacturing requirements.

According to another embodiment, the active column AC comprises two local bit lines 354a and 354b and two local source lines 355a and 355b. A channel region 356a is situated between the local bit lines 354a and the local source lines 355a. A channel region 356b is situated between the local bit lines 354b and the local source lines 355b. Likewise, a channel breaker 320 such as an insulating layer is positioned between the two local bit lines 354a and 354b so as to separate the channel region 356a from the channel region 356b. It is understood that in some embodiments, the channel breaker 320 may be omitted. For example, the channel region 356a, the local bit line 354a, the local source line 355a, the charge-storage element 334, and the word line 323p constitute the memory cell $T_1$. For example, the channel region 356b, the local bit line 354b, the local source line 355b, the charge-storage element 334, and the word line 323p constitute the memory cell $T_2$.

Figure 5:
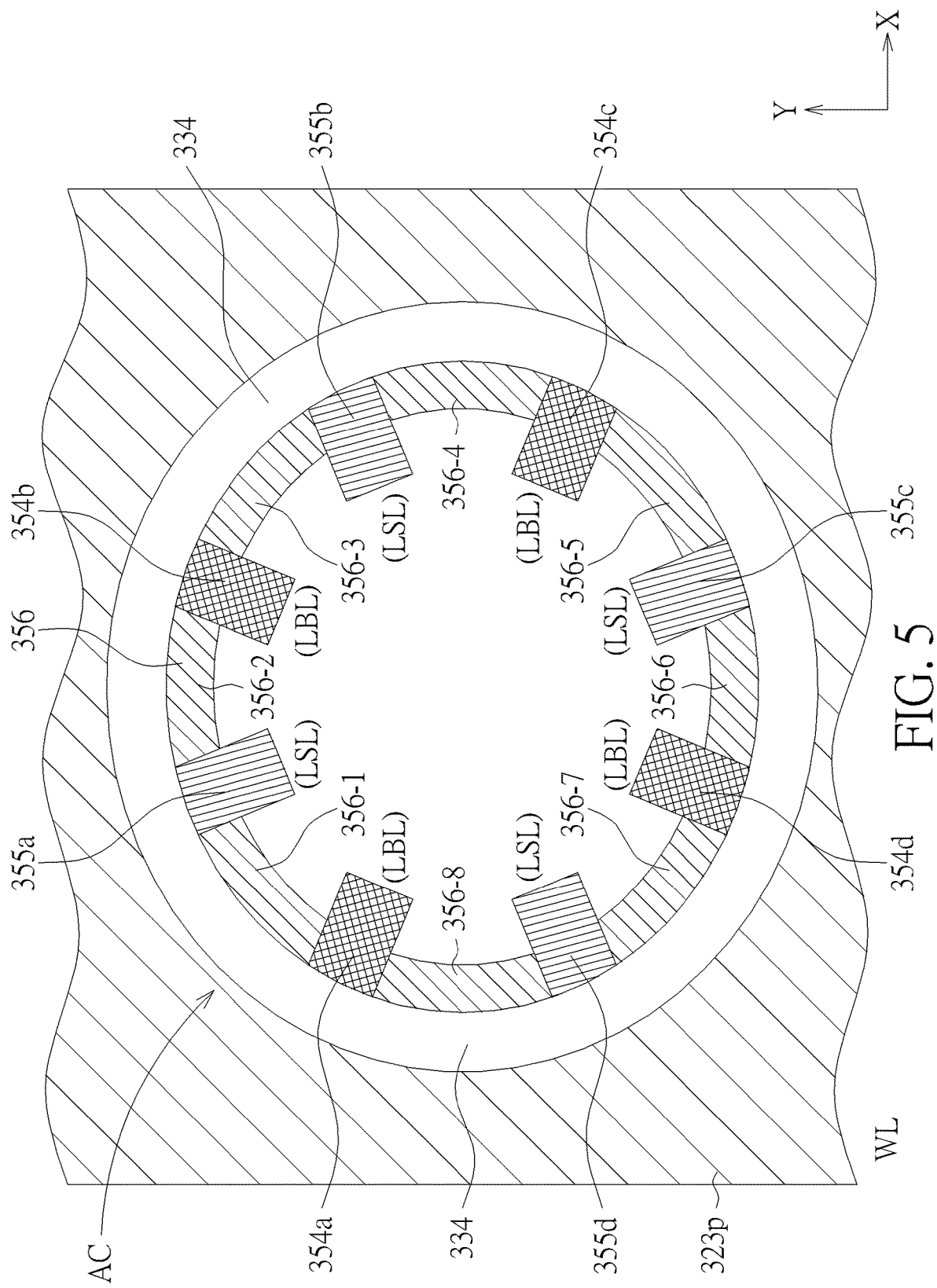
FIG. 5 is a schematic, cross-sectional diagram in the X-Y plane showing multiple local bit lines and multiple local source lines in one active column according to still another embodiment of the invention.

The number of signal lines LBL and LSL in each active column may dependent upon design requirements. In some embodiments, there may be more than two signal lines LBL and more than two signal lines LSL to further increase the storage density of the flash memory device. FIG. 5 is a schematic, cross-sectional diagram in the X-Y plane showing multiple local bit lines and multiple local source lines in one active column according to still another embodiment of the invention, wherein like numeral numbers designate like elements, regions or layers. As shown in FIG. 5, likewise, the active column AC is wrapped around by the word line WL. The active column AC comprises a vertical NOR string extending along the Z direction that is orthogonal to the planar surface of the substrate (not shown in FIG. 5).

It is understood that only one particular plane of the vertical NOR string in the active column AC is shown in FIG. 5. A circular silicon channel 356 is shown. A charge-storage element 334 comprising a charge-trapping layer is positioned between the silicon channel 356 and the word line WL. It is to be understood that the shapes of the silicon channel 356 and the active column AC are illustration purposes only. Other shapes such as oval shape, rectangular shape or irregular shape may be applicable according to various embodiments of the invention. It is to be understood that the shapes of the location of the signal lines LBL and LSL is for illustration purposes only. The location of the signal lines LBL and LSL may be adjusted according to processing/manufacturing requirements.

According to another embodiment, the active column AC comprises four local bit lines 354a~354d and four local source lines 355a~355d. The silicon channel 356 is divided into multiple channel regions 356-1~356-8 by the four local bit lines 354a~354d and four local source lines 355a~355d. In FIG. 5, no channel breaker is positioned between the local bit lines. Multiple memory cells can be formed so as to increase the storage density of the flash memory device. For example, the channel regions 356-1 and 356-8, the local bit line 354a, the two local source lines 355a and 355d adjacent to the local bit line 354a, the charge-storage element 334, and the word line 323p constitute one memory cell.

Figure 6:
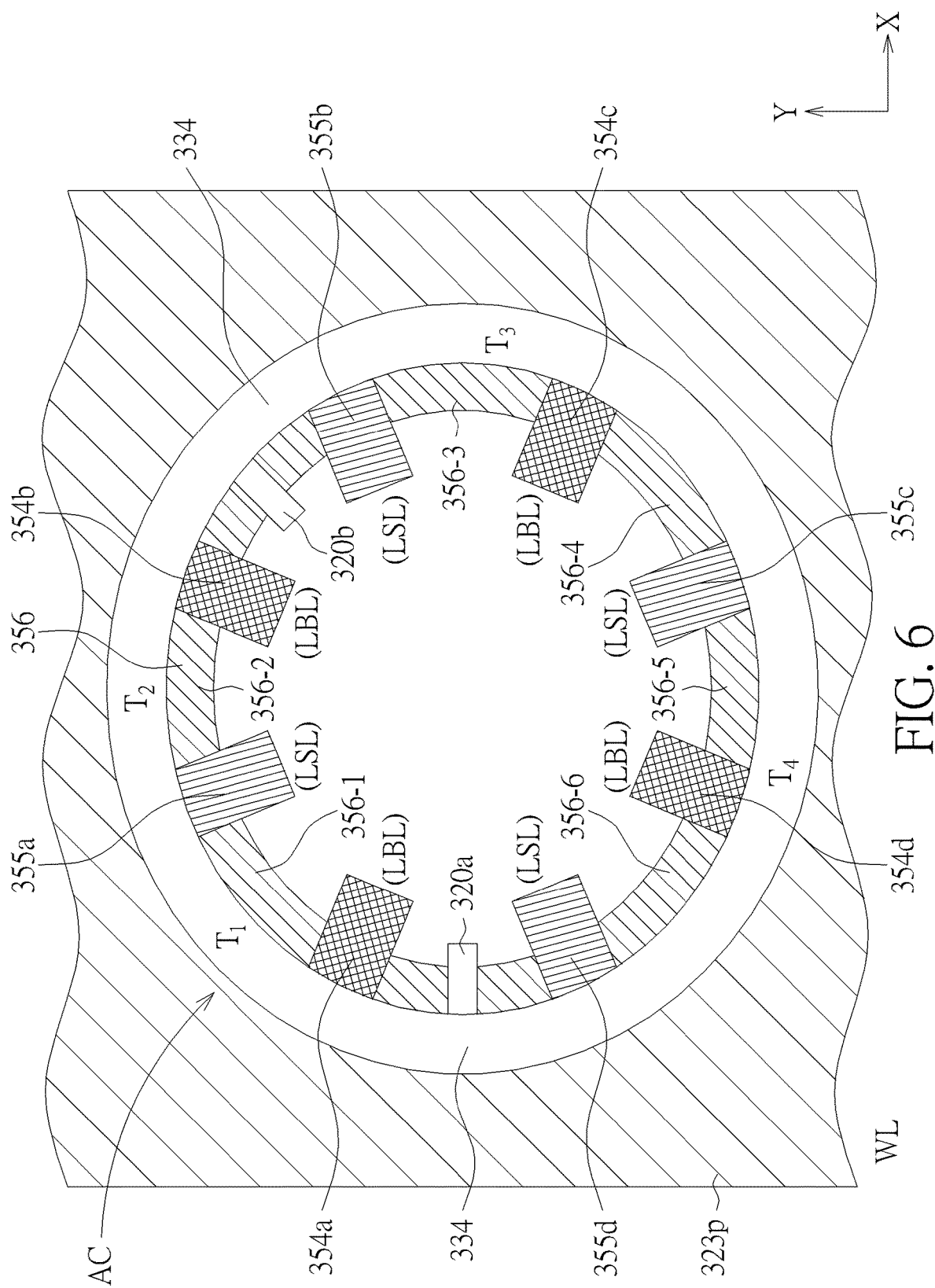
FIG. 6 is a schematic, cross-sectional diagram in the X-Y plane showing multiple local bit lines and multiple local source lines in one active column according to yet another embodiment of the invention.

FIG. 6 is a schematic, cross-sectional diagram in the X-Y plane showing multiple local bit lines and multiple local source lines in one active column according to yet another embodiment of the invention, wherein like numeral numbers designate like elements, regions or layers. As shown in FIG. 6, likewise, the active column AC is wrapped around by the word line WL. The active column AC comprises a vertical NOR string extending along the Z direction that is orthogonal to the planar surface of the substrate (not shown in FIG. 6).

It is understood that only one particular plane of the vertical NOR string in the active column AC is shown in FIG. 6. A circular silicon channel 356 is shown. A charge-storage element 334 comprising a charge-trapping layer is positioned between the silicon channel 356 and the word line WL. It is to be understood that the shapes of the silicon channel 356 and the active column AC are illustration purposes only. Other shapes such as oval shape, rectangular shape or irregular shape may be applicable according to various embodiments of the invention. It is to be understood that the shapes of the location of the signal lines LBL and LSL and the channel breaker is for illustration purposes only. The location of the signal lines LBL and LSL and the channel breaker may be adjusted according to processing/manufacturing requirements.

According to another embodiment, the active column AC comprises four local bit lines 354a~354d and four local source lines 355a~355d. The silicon channel 356 is divided into multiple channel regions 356-1~356-6 by the four local bit lines 354a~354d and four local source lines 355a~355d. Multiple memory cells can be formed so as to increase the storage density of the flash memory device. For example, the channel region 356-1, the local bit line 354a, the shared local source line 355a adjacent to the local bit line 354a, the charge-storage element 334, and the word line 323p constitute a memory cell $T_1$. For example, the channel region 356-2, the local bit line 354b, the shared local source line 355a adjacent to the local bit line 354b, the charge-storage element 334, and the word line 323p constitute a memory cell $T_2$. For example, the channel regions 356-3 and 356-4, the local bit line 354c, the two local source lines 355b and 355c adjacent to the local bit line 354c, the charge-storage element 334, and the word line 323p constitute a memory cell $T_3$. For example, the channel regions 356-5 and 356-6, the local bit line 354d, the two local source lines 355c and 355d adjacent to the local bit line 354d, the charge-storage element 334, and the word line 323p constitute a memory cell $T_4$.

In FIG. 6, two exemplary channel breakers 320a and 320b may be added to break the channel, though it is not a must have. It is understood that the two channel breakers 320a and 320b are for illustration purpose only. The number of channel breakers can be increased or reduced, as long as it does not affect the fact that each LBL can find at least one LSL besides it, and there is a continuous channel between the LBL and LSL. The location and the number of channel breakers in this figure is for illustration only. Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A three-dimensional flash memory device, comprising:
    a substrate having a substantial planar surface;
    a plurality of active columns of semiconducting material disposed above said substrate, each of said plurality of active columns extending along a first direction orthogonal to said planar surface of said substrate, wherein said plurality of active columns is arranged in a two-dimensional array, and wherein each of said plurality of active columns comprises at least two local bit lines and at least one local source line extending along said first direction;
    a first channel region between a first local bit line of said at least two local bit lines and said at least one local source line;
    a second channel region between a second local bit line of said at least two local bit lines and said at least one local source line;
    a word line stack wrapping around said plurality of active columns; and
    a charge-storage element disposed between said word line stack and each of said plurality of active columns.

2. The three-dimensional flash memory device according to claim 1, wherein said word line stack extends along a second direction that is parallel to said planar surface of said substrate.

3. The three-dimensional flash memory device according to claim 2, wherein said at least two local bit lines are electrically coupled to two global bit lines, respectively.

4. The three-dimensional flash memory device according to claim 3, wherein said two global bit lines extend along a third direction that is not parallel to said second direction and is parallel to said planar surface of said substrate.

5. The three-dimensional flash memory device according to claim 3, wherein each of said two global bit lines is electrically coupled to a bit-line access select transistor, wherein said bit-line access select transistor connects each of said two global bit lines to each of said at least two local bit lines.

6. The three-dimensional flash memory device according to claim 1, wherein said charge-storage element comprises a charge-trapping layer.

7. The three-dimensional flash memory device according to claim 6, wherein said charge-trapping layer comprises silicon nitride.

8. The three-dimensional flash memory device according to claim 1 further comprising:
    a channel breaker separating said first channel region from said second channel region.

9. The three-dimensional flash memory device according to claim 1, wherein said plurality of active columns is arranged in a staggered manner.

10. The three-dimensional flash memory device according to claim 1, wherein said substrate comprises a silicon substrate.

11. A three-dimensional flash memory device, comprising:
    a substrate having a substantial planar surface;
    a plurality of active columns of semiconducting material disposed above said substrate, each of said plurality of active columns extending along a first direction orthogonal to said planar surface of said substrate, wherein said plurality of active columns is arranged in a two-dimensional array, and wherein each of said plurality of active columns comprises multiple local bit lines and multiple local source lines extending along said first direction;

multiple channel regions between said multiple local bit lines and multiple local source lines;

a word line stack wrapping around said plurality of active columns; and a charge-storage element disposed between said word line stack and each of said plurality of active columns.

12. The three-dimensional flash memory device according to claim 11, wherein said word line stack extends along a second direction that is parallel to said planar surface of said substrate.

13. The three-dimensional flash memory device according to claim 12, wherein said multiple local bit lines are electrically coupled to multiple global bit lines, respectively.

14. The three-dimensional flash memory device according to claim 13, wherein said multiple global bit lines extend along a third direction that is not parallel to said second direction and is parallel to said planar surface of said substrate.

15. The three-dimensional flash memory device according to claim 13, wherein each of said multiple global bit lines is electrically coupled to a bit-line access select transistor, wherein said bit-line access select transistor connects each of said multiple global bit lines to each of said multiple local bit lines.

16. The three-dimensional flash memory device according to claim 11, wherein said charge-storage element comprises a charge-trapping layer.

17. The three-dimensional flash memory device according to claim 16, wherein said charge-trapping layer comprises silicon nitride.

18. The three-dimensional flash memory device according to claim 11 further comprising:

a channel breaker between two of said multiple local bit lines.

19. The three-dimensional flash memory device according to claim 11, wherein said plurality of active columns is arranged in a staggered manner.

20. The three-dimensional flash memory device according to claim 11, wherein said substrate comprises a silicon substrate.

* * * * *